(12) United States Patent
Azadet et al.

(10) Patent No.: US 7,868,798 B2
(45) Date of Patent: Jan. 11, 2011

(54) METHODS AND APPARATUS FOR WHITENING QUANTIZATION NOISE IN A DELTA-SIGMA MODULATOR USING DITHER SIGNAL

(75) Inventors: Kameran Azadet, Morganville, NJ (US); Samer Hijazi, Bethlehem, PA (US); Joseph H. Othmer, Ocean, NJ (US)

(73) Assignee: LSI Corporation, Milpitas, CA (US)

( * ) Notice: Subject to any disclaimer, the term of this patent is extended or adjusted under 35 U.S.C. 154(b) by 99 days.

(21) Appl. No.: 12/414,999

(22) Filed: Mar. 31, 2009

(65) Prior Publication Data

US 2010/0245136 A1    Sep. 30, 2010

(51) Int. Cl.
*H03M 1/20* (2006.01)
(52) U.S. Cl. .................. 341/131; 341/143
(58) Field of Classification Search ............ 341/76, 341/77, 131, 143
See application file for complete search history.

(56) References Cited

U.S. PATENT DOCUMENTS 5,073,778 A * 12/1991 Ueki et al. ............. 341/131
5,818,376 A * 10/1998 Bianchessi et al. ......... 341/143
7,411,534 B1 * 8/2008 Melanson .................. 341/131

FOREIGN PATENT DOCUMENTS

JP          06077824 A  *  3/1994

OTHER PUBLICATIONS

Gerzon et al., Optimal Noise Shaping and Dither of Digital Signal: Audio Engineering Society; 87th Convention of the AES, Oct. 1989, pp. 1-20.*

* cited by examiner

*Primary Examiner*—Howard Williams
(74) *Attorney, Agent, or Firm*—Ryan, Mason & Lewis, LLP

(57) ABSTRACT

Methods and apparatus are provided for whitening quantization noise in a delta-sigma modulator using a dither signal. An input signal is quantized using a predictive delta-sigma modulator by quantizing the input signal using a quantizer; adding a dither signal at a first location of the predictive delta-sigma modulator; determining a quantization error associated with the quantizer; removing the dither signal at a second location of the predictive delta-sigma modulator (for example, by subtracting a substantially similar version of the dither signal at the second location); generating an error prediction value using an error predictive filter; and subtracting the error prediction value from the input signal. The dither signal may be a white noise signal and may optionally be generated using a pseudo-random number generator.

15 Claims, 2 Drawing Sheets

METHODS AND APPARATUS FOR WHITENING QUANTIZATION NOISE IN A DELTA-SIGMA MODULATOR USING DITHER SIGNAL

FIELD OF THE INVENTION

The present invention is related to delta-sigma modulators and, more particularly, to techniques to reduce the correlation between the quantization noise and the input signal in such delta-sigma modulators.

BACKGROUND OF THE INVENTION

Delta-sigma ($\Delta$-$\Sigma$) modulators, sometimes referred to as sigma-delta ($\Sigma$-$\Delta$) modulators, encode higher resolution signals into lower resolution signals. Delta-sigma modulators have found increasing use in a range of modern electronic components, such as digital-to-analog converters (DACs), analog-to-digital converters (ADCs) and frequency synthesizers. For example, delta-sigma modulators have been proposed or suggested for directly synthesizing RF signals from information carrying digital base band signals.

Delta-sigma modulators typically quantize an input signal and determine a quantization error by comparing the input signal to the quantized output value. The quantization error is often assumed to be uncorrelated to the input signal. More typically, however, the error signal is correlated to the input. Thus, the delta-sigma modulator may suffer from noise coloration due to the correlation of the quantization noise with the input signal, particularly for low resolution quantizers.

A need therefore exists for techniques to reduce the correlation between the quantization noise and the input signal, without significantly degrading the signal to noise ratio.

SUMMARY OF THE INVENTION

Generally, methods and apparatus are provided for whitening quantization noise in a delta-sigma modulator using a dither signal. According to one aspect of the invention, an input signal is quantized using a predictive delta-sigma modulator by quantizing the input signal using a quantizer; adding a dither signal at a first location of the predictive delta-sigma modulator; determining a quantization error associated with the quantizer; removing the dither signal at a second location of the predictive delta-sigma modulator (for example, by subtracting a substantially similar version of the dither signal at the second location); generating an error prediction value using an error predictive filter; and subtracting the error prediction value from the input signal. The dither signal may be a white noise signal and may optionally be generated using a pseudo-random number generator.

A more complete understanding of the present invention, as well as further features and advantages of the present invention, will be obtained by reference to the following detailed description and drawings.

DETAILED DESCRIPTION

The present invention provides improved techniques for reducing the correlation between the quantization noise and the input signal in a delta-sigma modulator.

Figure 1:
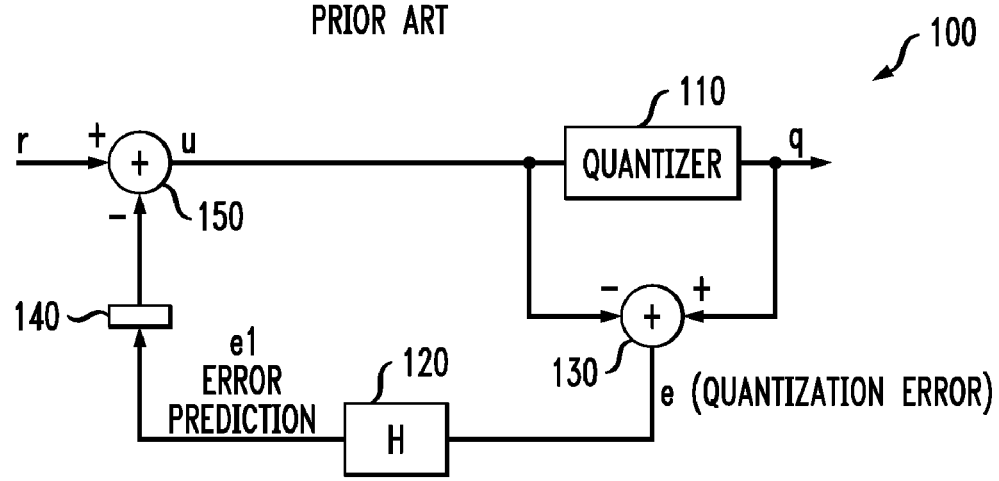
FIG. 1 illustrates an exemplary conventional delta-sigma modulator.

FIG. 1 illustrates an exemplary conventional delta-sigma modulator 100. As shown in FIG. 1, the exemplary delta-sigma modulator 100 employs a quantizer 110, such as a one bit quantizer, and an error predictive filter 120. The input value, u, to the quantizer 110 is compared to the quantized output value, q, by an adder 130 that generates a quantization error, e. The quantization error, e, is processed by the error predictive filter 120 to generate an error prediction value, e1, that is stored in a register 140 for one clock cycle and then subtracted from the input signal, r, by an adder 150 that generates the error-compensated input value, u. Generally, error predictive filters 120 employ some knowledge of the input signal to filter the signal, in a known manner. For example, if the error is known to be slowly varying, the error predictive filter 120 can use the same value for subsequent samples. The input signal, r, may be, for example, a 16 bit digital value, and the one bit quantization performed by the quantizer 110 (e.g., the quantization can be based on the polarity of the input signal) provides a coarse analog conversion. The quantization noise, e, associated with the one bit quantizer 110 is primarily out-of-band. As previously indicated, the one bit quantization performed by the exemplary quantizer 110 is inherently linear.

The quantization error, e(n), is often assumed to be uncorrelated to the input r(n). See, e.g., United States patent application entitled "Methods and Apparatus for Direct Synthesis of RF Signals Using Delta-Sigma Modulator," filed contemporaneously herewith and incorporated by reference herein. More typically, however, the error signal may be correlated to the input. Thus, the delta-sigma modulator 100 may suffer from noise coloration due to the correlation of the quantization noise with the input of the quantizer 110, particularly for low resolution quantizers, such as the one bit quantizers described herein. In order to reduce the effects of the correlation between the quantization noise and the input, a dithering configuration or a decorrelating configuration (or both) can be employed to reduce the noise correlation without significantly degrading the signal to noise ratio. For a more detailed discussion of a decorrelating configuration, see, and "Methods and Apparatus for Decorrelating Quantization Noise in a Delta-Sigma Modulator," filed contemporaneously herewith and incorporated by reference herein.

Typically, the one bit quantization performed by the quantizer 210 would require a high oversampling ratio. For example, audio encoding techniques that employ one bit quantization of audio signals that are on the order of 100 KHz typically oversample the audio signal at a rate of 20 MHz. Such oversampling is not practical in the wireless communication context of the present invention, where the signals are typically on the order of multiple GHz. The desired low oversampling rates of the present invention, however, would typically lead to an unstable encoder. As discussed hereinafter, aspects of the present invention provide techniques for providing a stable encoder based on one bit quantization.

According to one aspect of the invention, well-known dithering techniques are employed to reduce noise correlation to the quantizer 110 of the exemplary delta-sigma modulator 100 by introducing a dither signal at one point in the modulator loop and then introducing an inverse of the dither signal at another point in the modulator loop. In this manner, the introduced dither signal is cancelled, while providing the desired noise whitening properties of the dithering technique in the quantizer 110. Among other benefits, the disclosed dithering techniques reduce spurs in the in-band and out-of-band noise spectrum, and improve the stability of the loop 100 by reducing limit cycles (caused by the non-linear behavior of the coarse quantizer 110 in a closed loop. It is noted that even when noise spurs are out-of-band they can violate emission regulations, such as those specified by the FCC in the United States.

Figure 2A:
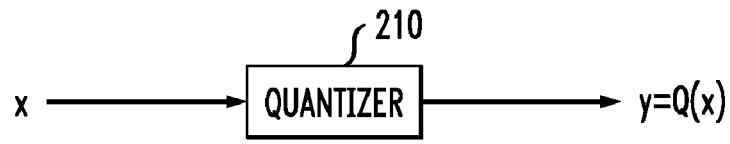
FIGS. 2A and 2B illustrate a conventional dithering technique for noise whitening.
Figure 2B:
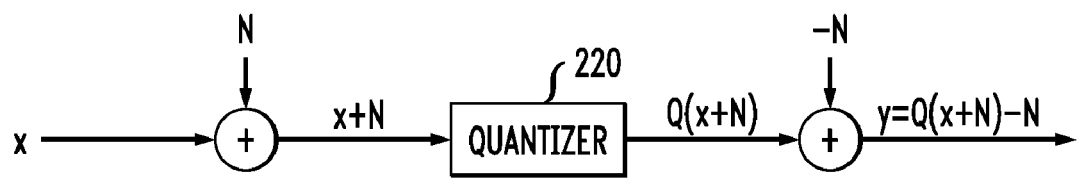

FIGS. 2A and 2B illustrate a conventional dithering technique for noise whitening. FIG. 2A illustrates a quantization of an input signal, x, by a quantizer 210, to generate a quantized output signal, y, equal to Q(x). FIG. 2B illustrates a quantization of an input signal, x, with dithering by a quantizer 220. As shown in FIG. 2B, a dither signal, N, is added to the input signal, x, prior to being quantized by the quantizer 220. The dithered input signal, x+N, is applied to the quantizer 220, which generates a quantized output, Q(x+N). The dither signal, N, is then removed from the quantized output, by adding an inverse, −N, of the dither signal. The output signal, y, is equal to Q(x+N)−N.

Generally, dithering techniques recognize that if the quantization error is de-correlated due to the addition of the dither noise to the input signal, x, then the output signal, y, is equal to Q(x+N)−N, which is equal to (x+N)+E−N, or x+E, where E is the quantization error, e.

It is noted that by adding the dither signal, N, to the quantizer input and subtracting the dither signal, N, from the quantizer output, the effect of the dither signal N is effectively canceled, and only the benefits of noise whitening of the non-linear quantizer Q remain. The present invention recognizes, however, that this dithering technique cannot be directly applied to the delta-sigma modulator 100 of FIG. 1 since the quantizer output must remain a quantized value (i.e., −N cannot be added to the quantizer output of in a delta-sigma modulator 100).

Figure 3:
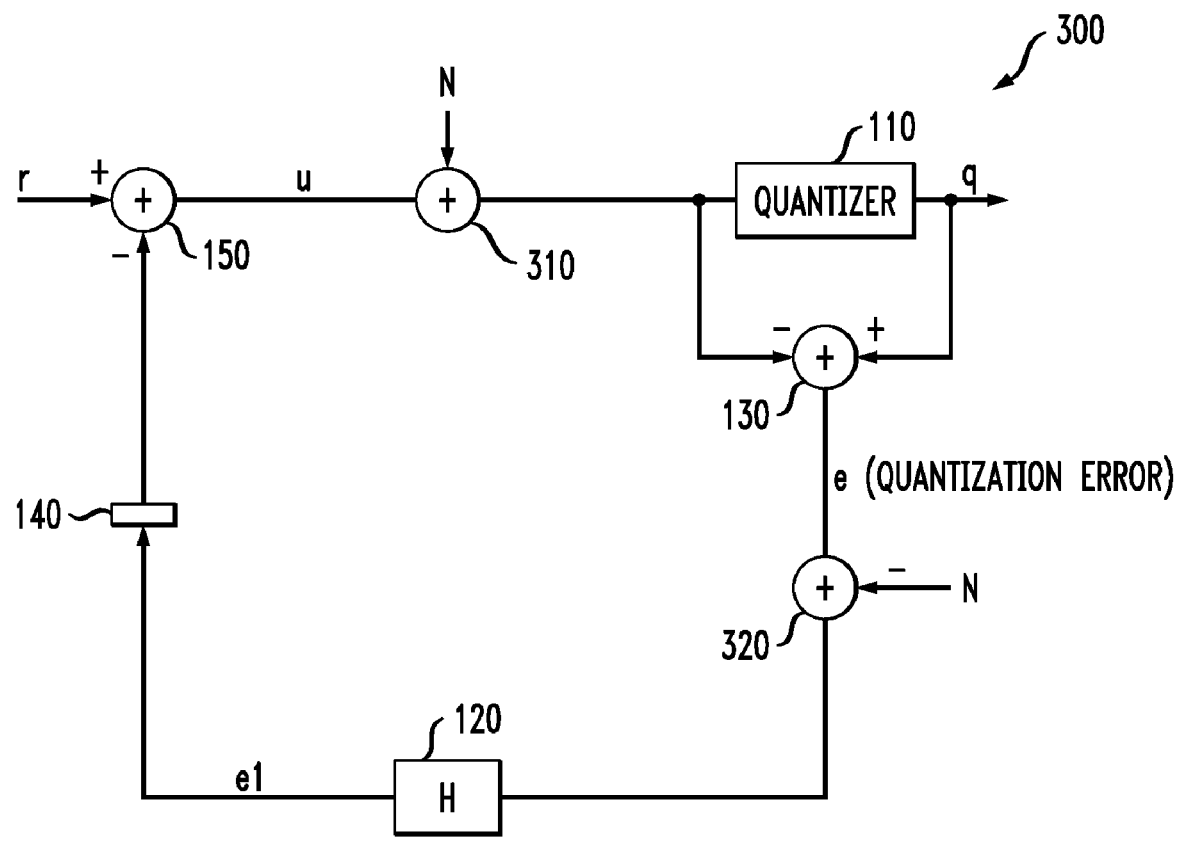
FIG. 3 illustrates an exemplary delta-sigma modulator in accordance with the dithering techniques of the present invention.

FIG. 3 illustrates an exemplary delta-sigma modulator 300 in accordance with the dithering techniques of the present invention. As shown in FIG. 3, the exemplary delta-sigma modulator 300 employs a one bit quantizer 110 and an error predictive filter 120, in a similar manner to the delta-sigma modulator 100 of FIG. 1. The input value to the quantizer 110 is compared to the output value, q, by an adder 130 that generates a quantization error, e. The quantization error, e, is processed by the error predictive filter 120 to generate an error prediction value, e1, that is stored in a register 140 for one clock cycle and then subtracted from the input signal, r, by an adder 150 that generates an error-compensated input value, u.

As shown in FIG. 3, the exemplary delta-sigma modulator 300 employs well-known dithering techniques to introduce a noise signal, N, such as white noise, using an adder 310. The noise (dither) signal may be generated, for example, using a pseudo-random number generator. A substantially similar version of the noise signal, N, is then subtracted by an adder 320 to cancel the introduced noise (alternatively, an inverse of the noise signal, N, can be added by the adder 320 to cancel the introduced noise).

It can be shown that the quanitization error, q, of the exemplary delta-sigma modulator 100 of FIG. 1 can be expressed as follows:

$$Q=R+(1-H)E. \tag{1}$$

It is noted that in the exemplary notation employed herein, lower case variables, such as q, indicate a time domain, while upper variables, such as Q, indicate a corresponding frequency (or z) domain. Likewise, it can be shown that the quanitization error, q, of the exemplary delta-sigma modulator 300 of FIG. 3 can be expressed as follows:

$$Q=R+(1-H)(E+N). \tag{2}$$

Significantly, the exemplary delta-sigma modulator 300 of FIG. 3 with dithering demonstrates an SFDR of approximately 95 dB.

Conclusion

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

We claim:

1. A method for quantizing an input signal using a predictive delta-sigma modulator, comprising:

quantizing said input signal using a quantizer;

adding a dither signal at a first location of said predictive delta-sigma modulator;

determining a quantization error associated with said quantizer;

removing said dither signal at a second location of said predictive delta-sigma modulator;

generating an error prediction value using an error predictive filter; and subtracting said error prediction value from said input signal.

2. The method of claim 1 wherein said dither signal is a white noise signal.

3. The method of claim 1, wherein said step of removing said dither signal further comprises the step of subtracting a substantially similar version of said dither signal at said second location.

4. The method of claim 1, wherein said dither signal is generated using a pseudo-random number generator.

5. The method of claim 1, wherein said dither signal is added in appropriate places in said delta-sigma modulator such that a contribution of said dither signal to an output power spectral density is shaped by said error predictive filter.

6. A predictive delta-sigma modulator for quantizing an input signal, comprising:

a quantizer for quantizing said input signal using;

a noise source for adding a dither signal at a first location of said predictive delta-sigma modulator;

a comparison circuit for determining a quantization error associated with said quantizer;

a first adder for removing said dither signal at a second location of said predictive delta-sigma modulator;

an error predictive filter to generate an error prediction value; and a second adder for subtracting said error prediction value from said input signal.

7. The predictive delta-sigma modulator of claim 6, wherein said dither signal is a white noise signal.

8. The predictive delta-sigma modulator of claim 6, wherein said first adder removes said dither signal by subtracting a substantially similar version of said dither signal at said second location.

9. The predictive delta-sigma modulator of claim 6, wherein said noise source is a pseudo-random number generator.

10. The predictive delta-sigma modulator of claim 6, wherein said dither signal is added in appropriate places in said delta-sigma modulator such that a contribution of said dither signal to an output power spectral density is shaped by said error predictive filter.

11. An integrated circuit, comprising:
a predictive delta-sigma modulator for quantizing an input signal, comprising:
a quantizer for quantizing said input signal using;
a noise source for adding a dither signal at a first location of said predictive delta-sigma modulator;
a comparison circuit for determining a quantization error associated with said quantizer;
a first adder for removing said dither signal at a second location of said predictive delta-sigma modulator;
an error predictive filter to generate an error prediction value; and
a second adder for subtracting said error prediction value from said input signal.

12. The integrated circuit of claim 11, wherein said dither signal is a white noise signal.

13. The integrated circuit of claim 11, wherein said first adder removes said dither signal by subtracting a substantially similar version of said dither signal at said second location.

14. The integrated circuit of claim 11, wherein said noise source is a pseudo-random number generator.

15. The integrated circuit of claim 11, wherein said dither signal is added in appropriate places in said delta-sigma modulator such that a contribution of said dither signal to an output power spectral density is shaped by said error predictive filter.

* * * * *